(12) United States Patent
Moon et al.

(10) Patent No.: US 11,508,454 B2
(45) Date of Patent: Nov. 22, 2022

(54) DATA STORAGE DEVICE AND METHOD OF OPERATING THE SAME

(71) Applicant: SK hynix Inc., Icheon-si (KR)

(72) Inventors: Min Hwan Moon, Icheon-si (KR); Se Joong Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 61 days.

(21) Appl. No.: 17/025,765

(22) Filed: Sep. 18, 2020

(65) Prior Publication Data

US 2021/0327529 A1    Oct. 21, 2021

(30) Foreign Application Priority Data

Apr. 16, 2020 (KR) .................. 10-2020-0046152

(51) Int. Cl.
| | | |
|---|---|---|
| *G06F 11/10* | (2006.01) | |
| *G11C 29/42* | (2006.01) | |
| *G11C 29/44* | (2006.01) | |
| *G11C 29/14* | (2006.01) | |
| *G11C 29/12* | (2006.01) | |
| *G11C 16/08* | (2006.01) | |
| *G11C 29/52* | (2006.01) | |

(52) U.S. Cl.
CPC .............. *G11C 29/42* (2013.01); *G11C 29/14* (2013.01); *G11C 29/44* (2013.01); *G11C 16/08* (2013.01); *G11C 29/52* (2013.01); *G11C 2029/1202* (2013.01)

(58) Field of Classification Search
CPC ......... G11C 29/42; G11C 29/14; G11C 29/44; G11C 2029/1202

USPC .................................................... 365/185.09
See application file for complete search history.

(56) References Cited

U.S. PATENT DOCUMENTS

| | | | | |
|---|---|---|---|---|
| 2009/0241008 A1* | 9/2009 | Kim | ............... | H03M 13/353 |
| | | | | 714/755 |
| 2012/0221913 A1* | 8/2012 | Anholt | ............... | G06F 11/1012 |
| | | | | 714/752 |
| 2014/0032992 A1* | 1/2014 | Hara | ............... | G06F 11/1008 |
| | | | | 714/773 |
| 2014/0053041 A1* | 2/2014 | Sakaue | ............... | H03M 13/293 |
| | | | | 714/E11.056 |
| 2016/0103734 A1* | 4/2016 | Chen | ............... | G06F 11/1076 |
| | | | | 714/764 |

(Continued)

FOREIGN PATENT DOCUMENTS

KR        10-1826051 B1      2/2018
KR    10-2018-0087494 A      8/2018

*Primary Examiner* — Ly D Pham
(74) *Attorney, Agent, or Firm* — Perkins Coie LLP

(57) ABSTRACT

A data storage device including a memory device and a memory controller is disclosed. The memory controller including a super block includes a parity controller in communication with a memory device including a plurality of pages and configured to generate a first parity using data to be written to a first group of pages among the plurality of pages, and generate a second parity using data to be written to a second group of pages among the plurality of pages, a write operation controller configured to control the memory device to store the first parity and the second parity, and an error correction circuitry coupled to apply the first parity and the second parity to correct at least one of the plurality of pages arranged to belong to the first group of pages and the second group of pages.

15 Claims, 14 Drawing Sheets

(56) References Cited

U.S. PATENT DOCUMENTS

| | | | |
|---|---|---|---|
| 2016/0232086 A1* | 8/2016 | Lee | G06F 12/0246 |
| 2017/0201273 A1* | 7/2017 | Bonke | G06F 11/1068 |
| 2018/0053545 A1* | 2/2018 | Son | G06F 11/1048 |
| 2018/0101430 A1* | 4/2018 | Ou | G11C 29/52 |
| 2018/0129430 A1* | 5/2018 | Kang | H03M 13/2757 |
| 2018/0210826 A1* | 7/2018 | Jo | G06F 11/1048 |
| 2018/0373586 A1* | 12/2018 | Kim | G06F 11/108 |
| 2019/0121695 A1* | 4/2019 | Son | G06F 3/0673 |
| 2020/0119754 A1* | 4/2020 | Kim | H03M 13/618 |

* cited by examiner

FIG. 7

| NUMBER OF PARITIES TO BE GENERATED | PARITY ADDRESS | SIZE OF SUPER BLOCK | parity_info

FIG. 8

| PARITY IDENTIFIER | PARITY ADDRESS | PARITY GENERATION COMPLETION INFORMATION |
|---|---|---|
| P2 | ADDRESS2 | FLAG2 |
| P3 | ADDRESS3 | FLAG3 |

TARGET WORD LINE

PARITY INFORMATION REGISTER

DATA STORAGE DEVICE AND METHOD OF OPERATING THE SAME

CROSS-REFERENCE TO RELATED APPLICATION

This patent document claims priority to and benefits of the Korean patent application number 10-2020-0046152, filed on Apr. 16, 2020, which is incorporated herein by reference in its entirety.

TECHNICAL FIELD

The disclosed technology relates to an electronic device, and more particularly, to a data storage device and a method of operating the same.

BACKGROUND

A data storage device is a device that is used to temporarily or permanently store data. The data storage device includes a memory device or memory medium and a memory controller to write or retrieve data to or from the memory device or memory medium. Such a memory device or memory medium may include a semiconductor memory formed of semiconductor materials such as silicon (Si), germanium (Ge), gallium arsenide (GaAs), or indium phosphide (InP). The memory device is largely classified into a volatile memory device and a non-volatile memory device.

The volatile memory device needs constant power supply to retain data. Examples of the volatile memory device may include a static RAM (SRAM), a dynamic RAM (DRAM), and a synchronous DRAM (SDRAM).

In contrast, the non-volatile memory device can retain stored data even in the absence of power supply. Examples of the non-volatile memory device may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and a ferroelectric RAM (FRAM). The flash memory is largely divided into a NOR type and a NAND type.

Maintaining or improving data integrity is an important feature for any data storage device and data transmission. Error-correction codes (ECCs) can be used to maintain or improve data integrity for various types of data storage devices including volatile or non-volatile memory devices. In particular, certain memory devices are unreliable and generally need to use ECCs to allow dramatic increase in data reliability at the expense of extra storage space for ECC parity bits, which will be used to detect and/or correct erroneous bits in read data.

SUMMARY

The embodiments of the disclosed technology, among other features and benefits, relate to a data storage device and its operating method that can improve data reliability.

In an implementation of the disclosed technology, a memory controller may include a parity controller in communication with a memory device including a plurality of pages and configured to generate a first parity using data to be written to a first group of pages among the plurality of pages, and generate a second parity using data to be written to a second group of pages among the plurality of pages, a write operation controller configured to control the memory device to store the first parity and the second parity, and an error correction circuitry coupled to apply the first parity and the second parity to correct at least one of the plurality of pages arranged to belong to the first group of pages and the second group of pages.

In another implementation of the disclosed technology, a data storage device may include a memory device including a plurality of groups of pages, a memory controller configured to control the memory device to store a first parity generated using data stored in a first group of pages and store a second parity generated using data stored in a second group of pages, and an error correction circuitry coupled and configured to apply the first parity and the second parity to correct at least one of the plurality of pages arranged to belong to the first group of pages and the second group of pages.

In another implementation of the disclosed technology, a data storage device may include a memory device including a super block including a plurality of pages corresponding to a plurality of word lines, a memory controller configured to control the memory device so that at least two or more parities are stored in pages corresponding to a weak word line among the plurality of word lines, wherein the at least two or more parities include a first parity generated using data stored in a first group and a second parity generated using data stored in a second group, among the plurality of pages, and an error correction circuitry coupled and configured to apply the first parity and the second parity to correct at least one of the plurality of pages arranged to belong to the first group of pages and the second group of pages.

In another implementation of the disclosed technology, a memory controller controlling an operation of a memory device including a super block including a plurality of pages may include a parity controller configured to generate a first parity using data to be stored in a first group among the plurality of pages, and generate a second parity using data to be stored in a second group among the plurality of pages, and a write operation controller configured to control the memory device to store the first parity and the second parity in the super block, and the first group and the second group may commonly include at least two or more pages among the plurality of pages.

In another implementation of the disclosed technology, a data storage device may include a memory device including a super block including a plurality of pages, and a memory controller configured to control the memory device to store a first parity generated using data stored in a first group and store a second parity generated using data stored in a second group, in the super block, among the plurality of pages, and the first group and the second group may commonly include at least two or more pages among the plurality of pages.

In another implementation of the disclosed technology, a data storage device may include a memory device including a super block including a plurality of pages corresponding to a plurality of word lines, and a memory controller configured to control the memory device so that at least two or more parities are stored in pages corresponding to a weak word line among the plurality of word lines, the at least two or more parities may include a first parity generated using data stored in a first group and a second parity generated using data stored in a second group, among the plurality of pages, and the first group and the second group may commonly include at least two or more pages among the plurality of pages.

According to an embodiment of the present technology, a data storage device having improved reliability and a method of operating the same are provided.

BRIEF DESCRIPTION OF THE DRAWINGS

FIG. 7 illustrates an example of parity information.

FIG. 8 illustrates information stored in a parity information register according to the parity information.

DETAILED DESCRIPTION

Figure 1:
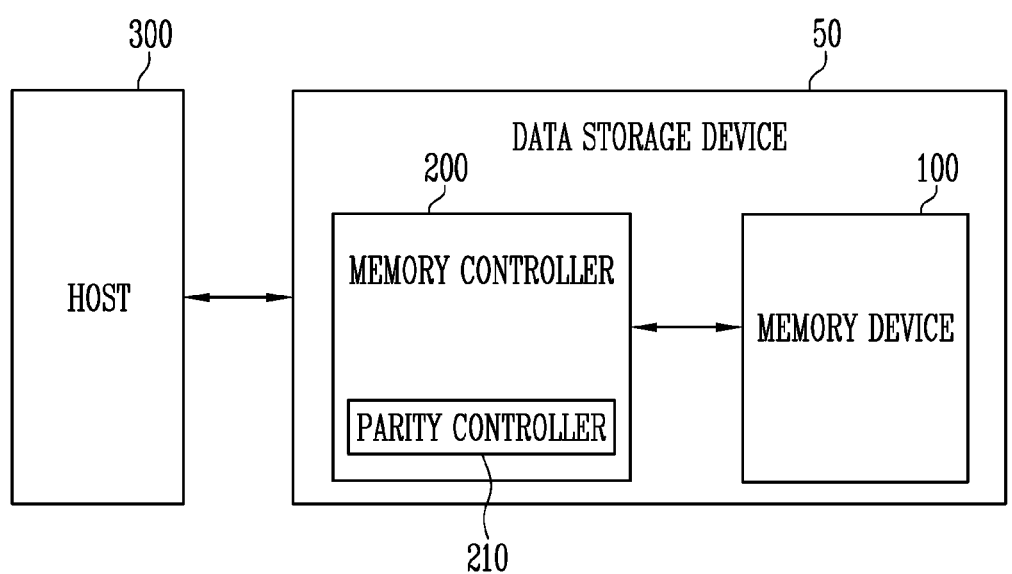
FIG. 1 illustrates an example of a data storage device based on an embodiment of the disclosed technology.

FIG. 1 illustrates an example of a data storage device based on an embodiment of the disclosed technology.

In some implementations, a data storage device 50 may include a memory device 100 and a memory controller 200 that controls an operation of the memory device.

The data storage device 50 may be a device that stores data in response to commands and control signals received from a host 300 such as a cellular phone, a smartphone, an MP3 player, a laptop computer, a desktop computer, a game player, a TV, a tablet PC, or an in-vehicle infotainment system.

The data storage device 50 may be manufactured as one of various types of data storage devices according to a host interface that provides a communication method with the host 300. Examples of the data storage device 50 may include data storage devices such as an SSD, a multimedia card in a form of an MMC, an eMMC, an RS-MMC and a micro-MMC, a secure digital card in a form of an SD, a mini-SD and a micro-SD, a universal serial bus (USB) data storage device, a universal flash storage (UFS) device, a personal computer memory card international association (PCMCIA) card type data storage device, a peripheral component interconnection (PCI) card type data storage device, a PCI express (PCI-E) card type data storage device, a compact flash (CF) card, a smart media card, and a memory stick.

The data storage device 50 may be manufactured as any one of various types of packages. Example packages for the data storage device 50 may include a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to commands and control signals received from the memory controller 200. The memory device 100 may include a memory cell array including a plurality of memory cells that store data.

Each of the memory cells may be configured as a single level cell (SLC) storing one data bit, a multi-level cell (MLC) storing two data bits, a triple level cell (TLC) storing three data bits, or a quad level cell (QLC) storing four data bits.

The memory cells of a memory cell array may be grouped into memory pages where each memory page is formed by adjacent memory cells and such memory pages can be further grouped into memory blocks where each block is formed by adjacent pages. In an embodiment, one page may be the smallest unit for writing data in the memory device 100 or the smallest for reading data from the memory device 100. The memory block of multiple memory pages may be the smallest unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In some embodiments of the disclosed technology that are discussed in this patent document, it is assumed that the memory device 100 is a NAND flash memory, by way of example only.

The memory device 100 may receive a command and an address from the memory controller 200. The memory device 100 is configured to access an area selected by the received address of the memory cell array. Accessing the selected area means performing an operation corresponding to the received command on the selected area. For example, the memory device 100 may perform a write operation (program operation), a read operation, and an erase operation. During the program operation, the memory device 100 may program data to the area selected by the address. During the read operation, the memory device 100 may read data from the area selected by the address. During the erase operation, the memory device 100 may erase data stored in the area selected by the address.

The memory controller 200 controls an overall operation of the data storage device 50.

When power is applied to the data storage device 50, the memory controller 200 may execute firmware (FW). The firmware FW may include a host interface layer HIL that receives the request input from the host 300 or outputs a response to the host 300, a flash translation layer (FTL) that manages an operation between an interface of the host 300 and an interface of the memory device 100, and a flash interface layer (FIL) that provides a command to the memory device 100 or receive the response from the memory device 100.

In an embodiment, the memory controller 200 may receive data and a logical address (LA) from the host 300, and may convert a logical address into a physical address (PA) indicating an address of memory cells in which data included in the memory device 100 is to be stored. The LA may be a logical block address (LBA), and the PA may be a physical block address (PBA).

The memory controller 200 may control the memory device 100 to perform the program operation, the read operation, or the erase operation according to the request of the host 300. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may control the memory device 100 to perform the program operation, the read operation, or the erase operation by itself regardless of the request from the host 300. For example, the memory controller 200 may control the memory device 100 to perform the program operation, the read operation, or the erase operation used to perform a background operation such as wear leveling, garbage collection, or read reclaim.

Referring to FIG. 1, the memory controller 200 may further include a parity controller 210.

Various methods may be used to increase reliability of data stored in the memory device 100. The memory controller 200 based on an embodiment may generate a parity. The parity may be data that recovers data in which an error occurs when the error occurs as a result of reading the data stored in the memory device 100.

Specifically, the memory device 100 may include a plurality of memory chips. Each of the plurality of memory chips may include a plurality of memory blocks. Each of the plurality of memory blocks may include a memory cell. The plurality of memory blocks may be grouped into a super block. The super block may be a unit that generates one parity.

That is, as a result of performing an operation using the data included in the super block, one parity may be generated. For example, the operation may be an exclusive OR (XOR) operation. Alternatively, the super block may be expressed as an area in which the generated parity may recover the error. That is, when the error occurs in some of the data included in the super block, the data in which the error occurs may be recovered, by using the parity generated by a corresponding super block.

The disclosed technology may be used to control a memory device based on a group of blocks as a "super block." In some implementations, a set of adjacent logical blocks may form a super block. Super blocks are mapped at coarse granularity while pages inside the super block are mapped at fine granularity to a location in physical blocks. For example, a super block may span across multiple chips, dies, and planes. In some implementations, each super block may store parity information within each super block to recover data when error correction codes (ECC) within a single chip or plane fail to recover the data.

In an embodiment, the parity controller 210 may determine the number of parities to be generated according to the physical address converted from the logical address which is received from the host 300. Alternatively, the parity controller 210 may determine the super block generating the parity according to the physical address.

For example, it is assumed that the physical address of a memory cell includes a predetermined target address. The parity controller 210 may generate the parity using a super block having a size smaller than a super block of a predetermined size. That is, two or more parities corresponding to sizes of different super blocks may be generated. Here, the different super blocks may include some overlapping memory blocks.

In an embodiment, the memory controller 200 may further include an error correction circuitry coupled to the parity controller 210. The error correction circuitry applies a parity to correct at least one of a plurality of pages arranged to belong to a group of pages. For example, the error correction circuitry applies a first parity to correct at least one of a plurality of pages arranged to belong to a first group of pages. For example, the error correction circuitry applies a first parity and a second parity to correct at least one of a plurality of pages arranged to belong to a first group of pages and a second group of pages.

The host 300 may communicate with the data storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
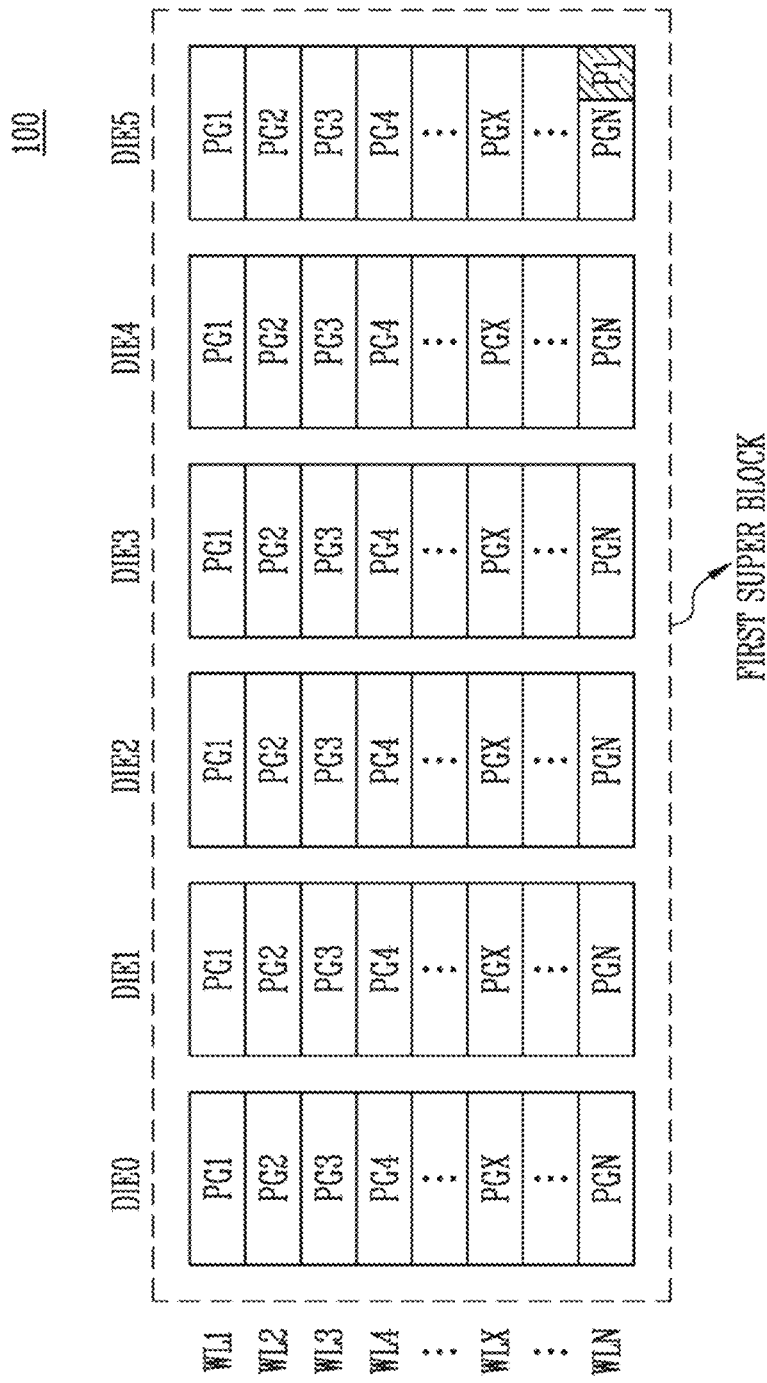
FIG. 2 is a diagram illustrating a memory device including a memory space storing one or more parity bits based on an embodiment of the disclosed technology.

FIG. 2 is a diagram illustrating the memory device including a memory space storing one or more parity bits based on an embodiment of the disclosed technology.

Referring to FIG. 2, the memory device 100 may include a plurality of memory dies DIE0 to DIE5. Each memory die may include a plurality of pages PG1 to PGN. One page may be defined as memory cells connected to the same word line.

Referring to FIG. 2, a 0-th die DIE0 may include first pages to N-th pages PG1 to PGN. The first to N-th pages PG1 to PGN may correspond to a first word line WL1 to an N-th word line WLN, respectively.

In an embodiment, a first die DIE1 may include the first to N-th pages PG1 to PGN. The first to N-th pages PG1 to PGN may correspond to the first word line WL1 to the N-th word line WLN, respectively.

In the same manner, a second die DIE2 to a fifth die DIE5 are shown in FIG. 2. A word line number shown in FIG. 2 may be an identification number for indicating a physical memory location of each of the plurality of pages included in the memory die. For example, the first page PG1 included in the 0-th die DIE0 may be memory cells connected to the first word line WL1 included in the 0-th die DIE0. The first page PG1 included in the first die DIE1 may be different from the first page PG1 included in the 0-th die DIE0, and may be memory cells connected to the first word line WL1 included in the first die DIE1.

In other words, for each die, the first word line WL1 to the N-th word line WLN may indicate the identification number indicating the physical memory location of each of the plurality of pages PG1 to PGN in each memory die.

Referring to FIG. 2, the memory device 100 may include a first super block. For example, the first super block may include the 0-th to fifth dies DIE0 to DIE5 shown in FIG. 2. That is, the first super block may include all of the plurality of pages PG1 to PGN included in the 0-th to fifth dies DIE0 to DIE5. In other words, the first super block may be a group of pages, and the corresponding group may include two or more pages. Therefore, the first super block may be a first group or a first page group.

Referring to FIG. 2, a first parity P1 may be generated using the first super block, and the generated first parity P1 may be stored in the memory device 100. Specifically, the first parity P1 may be generated using data stored in the first super block. For example, the first parity P1 may be generated by an XOR operation. When a read error occurs from the first super block, the data with errors may be recovered using the first parity P1.

In an embodiment, one page PG shown in FIG. 2 may be the smallest unit of data that can be recovered using the parity. For example, the XOR operation may be performed on data to be stored in the first to N-th pages PG1 to PGN of the 0-th die DIE0, the first to N-th pages PG1 to PGN of the first die DIE1, the first to N-th pages PG1 to PGN of the second die DIE2, the first to N-th pages PG1 to PGN of the third die DIE3, the first to N-th pages PG1 to PGN of the fourth die DIE4, and the first to N-th pages PG1 to PGN of the fifth die DIE5. As a result, the first parity P1 may be generated.

Read errors can occur when reading the first to N-th pages PG1 to PGN of the 0-th die DIE0, the first to N-th pages PG1 to PGN of the first die DIE1, the first to N-th pages PG1 to PGN of the second die DIE2, the first to N-th pages PG1 to PGN of the third die DIE3, the first to N-th pages PG1 to PGN of the fourth die DIE4, and the first to N-th pages PG1 to PGN of the fifth die DIE5. Here, the read errors from a page with one or more errors can be corrected by performing the XOR operation on the data and the first parity P1 stored in all other pages included in the first super block except for the page with one or more errors. That is, if a read error occurs from reading a page in the first super block, the error can be corrected using the first parity P1.

In an embodiment, the XOR operation and a data recovery method may be used. Let data of a P-th page (not shown) be "11010011." Let data of a Q-th page (not shown) be "00111011." Let data of an R-th page (not shown) be "11111111." The P-th page, the Q-th page, and the R-th page are part of one super block. A parity value "00010111" may be obtained by performing the XOR operation on the data of the P-th page, the data of the Q-th page, and the data of the R-th page.

Here, suppose one of the pages in the super block generates a read error. For example, suppose the data read from the Q-th page includes an error. In this case, the XOR operation may be performed on the P-th page, the R-th page, and the parity. That is, "00111011" is obtained by performing XOR operation on "11010011," "11111111," and "00010111," thereby recovering the original data of the Q-th page.

In this way, read errors from the first super block shown in FIG. 2 may be corrected. Thus, when the read error occurs from one page PG, the data stored in the page may be recovered using the first parity P1.

The number of memory dies included in the first super block or the number of pages included in each memory die discussed in this patent document are provided by way of example only.

Figure 3:
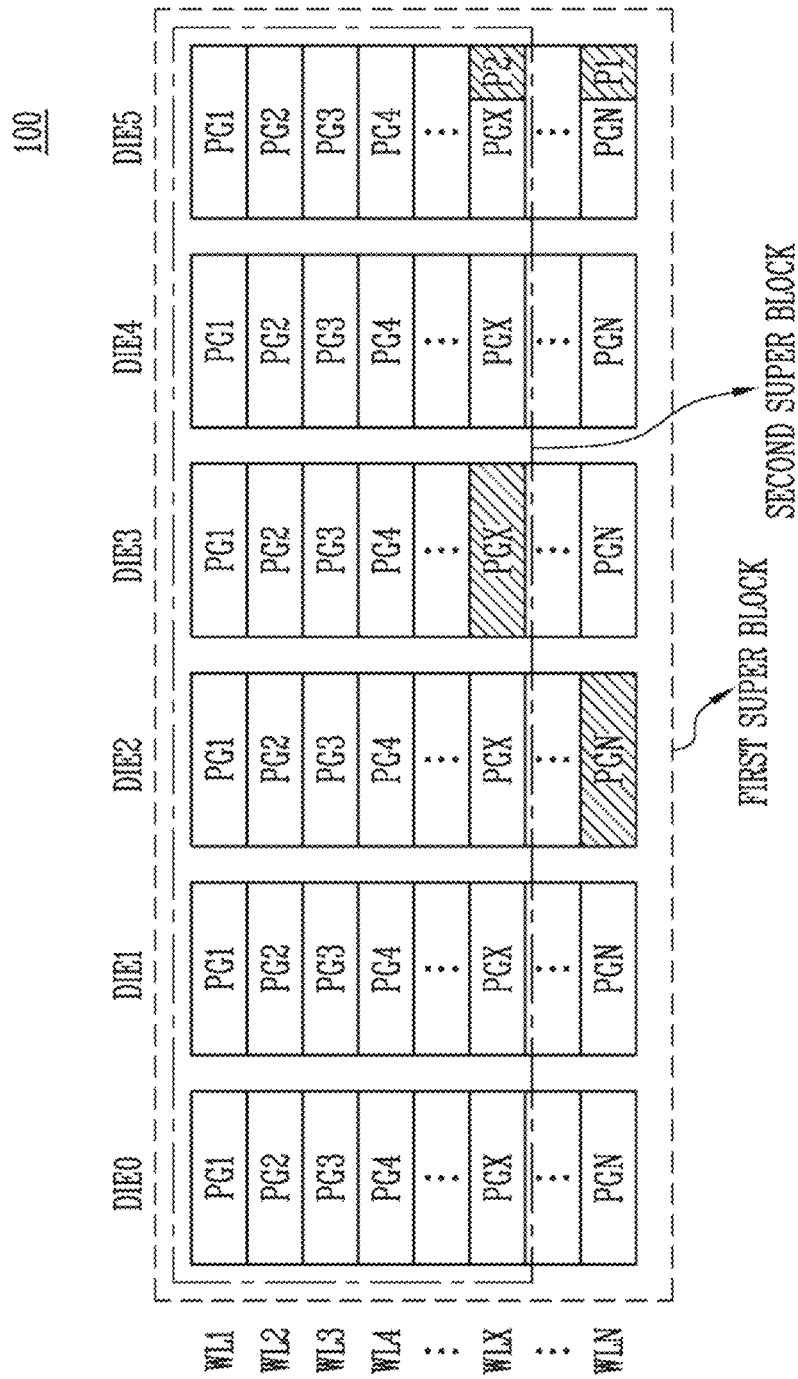
FIG. 3 illustrates an example of a data recovery scheme using the one or more parity bits based on an embodiment of the disclosed technology.

FIG. 3 illustrates an example of a data recovery scheme using the one or more parity bits based on an embodiment of the disclosed technology.

In some implementations, the memory device 100 may include a first super block and a second super block. In one example, the first super block and the first parity P1 corresponding to the first super block may be the same as those described with reference to FIG. 2.

Referring to FIG. 3, the memory device 100 may have improved error detection and/or correction capability. In an embodiment, the memory device 100 may include two or more parity bits or two or more sets of parity bits. In an embodiment, when one or more erroneous bits are detected while reading the data stored in any one of the pages included in the first super block, the errors are corrected, and the data may be recovered using the first parity P1. When two or more pages include errors, the first parity P1 may not be sufficient to correct the errors. When one parity is used, the error occurring in one page may be recovered. Therefore, the memory device 100 may include the second super block along with the first super block. In some implementations, the second super block can include memory cells that are included in the first super block. In terms of the memory cells that constitute super blocks, the second super block can overlap the first super block. In some implementations, the size of the second super block may be equal to or smaller than the size of the first super block. As will be discussed below, in some implementations, the size of the second super block may be smaller than the size of the first super block.

In an embodiment, the first super block may be the first group or the first page group as the group including the plurality of pages PG1 to PGN included in the 0-th to fifth dies DIE0 to DIE5. In addition, the second super block may be a second group or a second page group as a group including a plurality of pages PG1 to PGX included in the 0-th to fifth dies DIE0 to DIE5.

Referring to FIG. 3, when an error occurs in the N-th page PGN included in the second die DIE2, the error may be recovered using the first parity P1 included in the first super block. Alternatively, when an error occurs in an X-th page PGX included in the third die DIE3, the error may be recovered using the first parity P1 included in the first super block. That is, the data that is correctable using the first parity P1 may be in one page among the plurality of pages included in the first super block.

Read errors can be caused by distorted or overlapped threshold voltage distribution due to, e.g., program and erase (P/E) cycle, cell-to-cell interference, and data retention errors. Read errors from one page may be managed in most situations by using the first parity P1. However, read errors may occur from two or more pages included in the first super block.

Referring to FIG. 3, if there is an error in data read from the X-th page PGX included in the third die DIE3 and the N-th page PGN included in the second die DIE2, the first parity P1 alone may not correct the error since two or more pages include the error. In some embodiments of the disclosed technology, the memory device 100 may further include a second parity P2 corresponding to the second super block included in the first super block.

In some embodiments of the disclosed technology, the data stored in the X-th page PGX of the third die DIE3 included in the second super-block of which the size is smaller than that of the first super block may be first recovered using the second parity P2.

Once the error from the X-th page PGX is corrected, the remaining error from the N-th page PGN of the second die DIE2 may be recovered using the first parity P1 corresponding to the first super block. That is, the read error from one page may be corrected and the original data may be recovered using the parity corresponding to the smaller sized second super block included in the first super block, and then the read error from the other page may be corrected and the original data may be recovered using the parity corresponding to the first super block.

In some embodiments of the disclosed technology, a super block can be configured such that a memory area belongs to more than one super block and more than one parity can be used to correct errors from such a memory area. For example, a memory area in the first super block can also belong to the second super block. In such a case, the first super block uses a first parity to correct read errors from the first super block, and the second super block uses a second parity to correct read errors from the second super block. Therefore, the memory area that belongs to the first and second super block can use the first and second parities.

The memory device 100 based on an embodiment may include a plurality of parities, and each of the parities may not be generated by a super block of a fixed size, but may be generated by a super block of a variable size. That is, the size of data that is correctable by the plurality of parities may vary. In addition, memory areas that use the plurality of parities to correct errors may overlap with each other.

In an embodiment, the memory device 100 may use more than one parity on a predetermined physical address. Therefore, when a writing operation is performed on the predetermined physical address, two or more parities may be generated and written to the predetermined physical address along with data. When two or more parities are used, reliability of data may be improved compared to using one parity. In some implementations, the sizes of the super blocks can indicate the size of memory area that can be corrected using the corresponding parities, and the sizes of the super blocks may different from one another. In some implementations, different super blocks may overlap each other in terms of the memory areas the super blocks cover.

Figure 4:
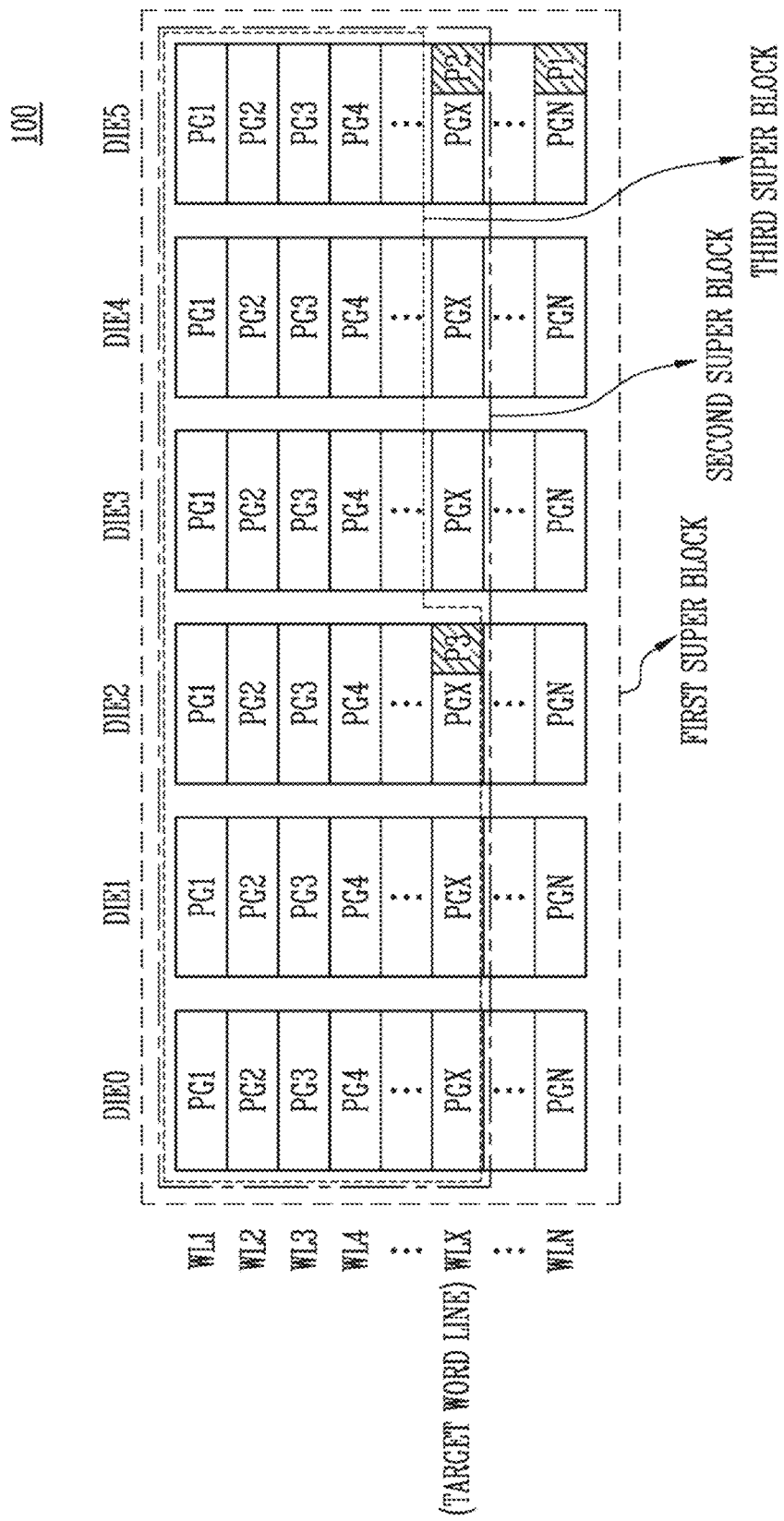
FIG. 4 illustrates an example of a data recovery scheme using two or more parities stored in memory spaces associated with a target word line based on an embodiment of the disclosed technology.

FIG. 4 illustrates an example of a data recovery scheme using two or more parities stored in memory spaces associated with a target word line based on an embodiment of the disclosed technology.

In some implementations, each of the 0-th to fifth dies DIE0 to DIE5 may include any one word line selected from among the plurality of word lines WL1 to WLN. The selected one word line may be defined as the target word line. The target word line WLX may indicate memory cells included in the X-th page PGX. For example, the target word line WLX may be a word line in which data reliability is weak among the word lines included in the memory device 100.

The target word line WLX may be determined based on the tendency of causing read errors. For example, word lines that are accessed more frequently may cause more errors that other word lines since more read voltages have been applied to those word. A specific word line may have a higher error rate than other word lines due to its physical location. In the context of this patent document, the word line having a relatively high error rate may be referred to as a "weak" word line, and may be determined as the target word line WLX.

In some embodiments of the disclosed technology, more parities are allocated to read operations associated with the weak word line, as compared to read operations associated with a normal or strong word line.

Information on the target word line WLX may be stored in the memory device 100 in advance. For example, referring to FIG. 4, the X-th word line PGX may be coupled to a physical memory location having the relatively high error rate or a physical memory location that creates errors more frequently. That is, in the 0-th die DIE0, the X-th page PGX, which is memory cells connected to the X-th word line PGX may have a relatively high error rate. Similarly, in the first to fifth dies DIE1 to DIE5, the X-th page PGX, which is memory cells connected to the X-th word line PGX may have a relatively high error rate.

In an embodiment, whether to generate two or more parities may be determined according to a physical address. Alternatively, according to the physical address, the size of the super block indicating the area correctable using the corresponding parity may be different from each other. Alternatively, a memory location where the parity is stored may be determined according to the physical address to be corrected by the parity.

Referring to FIG. 4, the memory device 100 may include a first super block, a second super block, and a third super block. The first and second super blocks and the first and second parities P1 and P2 corresponding to the respective super blocks are the same as those described with reference to FIG. 3.

In an embodiment, the first super block may be the first group or the first page group as the group including the plurality of pages PG1 to PGN included in the 0-th to fifth dies DIE0 to DIE5. The second super block may be the second group or the second page group as the group including the plurality of pages PG1 to PGX included in the 0-th to fifth dies DIE0 to DIE5. In addition, the third super block may be a third group or a third page group as a group including a plurality of pages PG1 to PGX−1 included in the third to fifth dies DIE3 to DIE5.

When a write request for writing data to the memory device is sent by the host, the data to be written and the logical address may be provided to the memory controller. The memory controller may convert the logical address received from the host into the physical address indicating the address of the memory cells in which the data is to be written.

The memory controller based on an embodiment may determine whether the converted physical address includes the physical address indicating the target word line. When the converted physical address includes the target word line, the memory controller may generate parities corresponding to two or more super blocks having different sizes. Specifically, the first parity corresponding to the first super block having a preset size and the second parity corresponding to the second super block included in the first super block may be generated. In addition, when the target word line has a high error rate, the memory controller may further generate a third parity corresponding to the third super block included in the second super block.

Specifically, the data to be written to the memory device 100 may be transmitted to the memory controller. In addition, the logical address received from the host may be converted into the physical address indicating the address of the memory cells in which the data to be written.

Referring to FIG. 4, the converted physical address may indicate the first to N-th word lines WL1 to WLN respectively included in the 0-th to fifth dies DIE0 to DIE5. Let the target word line be the X-th word line WLX. Since the converted physical address includes the X-th word line WLX which is the target word line, the memory controller may generate at least two or more parities including the first parity P1 corresponding to the first super block. For example, the memory controller may generate the first parity P1 corresponding to the first super block, the second parity P2 corresponding to the second super block, and the third parity P3 corresponding to the third super block. The generated first to third parities P1 to P3 may be stored in a predetermined memory location of the memory device 100.

Referring to FIG. 4, the second parity P2 and the third parity P3 may be stored in the X-th word line WLX which is the target word line. The memory location where the third parity P3 is stored may be the X-th word line WLX of the second die DIE2. The memory location where the second parity P2 is stored may be the X-th word line WLX of the fifth die DIE5.

In operation, a range of the data in which the error may be recovered using the first parity P1 may be the data included in the first super block. A range of the data in which the error may be recovered using the second parity P2 may be the data included in the second super block. A range of the data in which the error may be recovered using the third parity P3 may be the data included in the third super block. That is, an error correction circuitry coupled to a parity controller corrects the data included in the first super block according to the first parity P1. The error correction circuitry corrects the data included in the second super block according to the second parity P2. The error correction circuitry corrects the data included in the third super block according to the third parity P3.

In comparison with an error correction operation using only the first parity P1 to recover the data with one or more errors, the data storage device and the memory controller based on some embodiments of the disclosed technology can use the second parity P2 and the third parity P3 together, and thus the error correction can be achieved in more data than using the first parity alone.

In various embodiments, the second parity P2 and the third parity P3 may be stored in a page connected to the target word line. Therefore, even though a lot of errors occur in the data stored in the page connected to the target word line, the data may be normally recovered.

Figure 5:
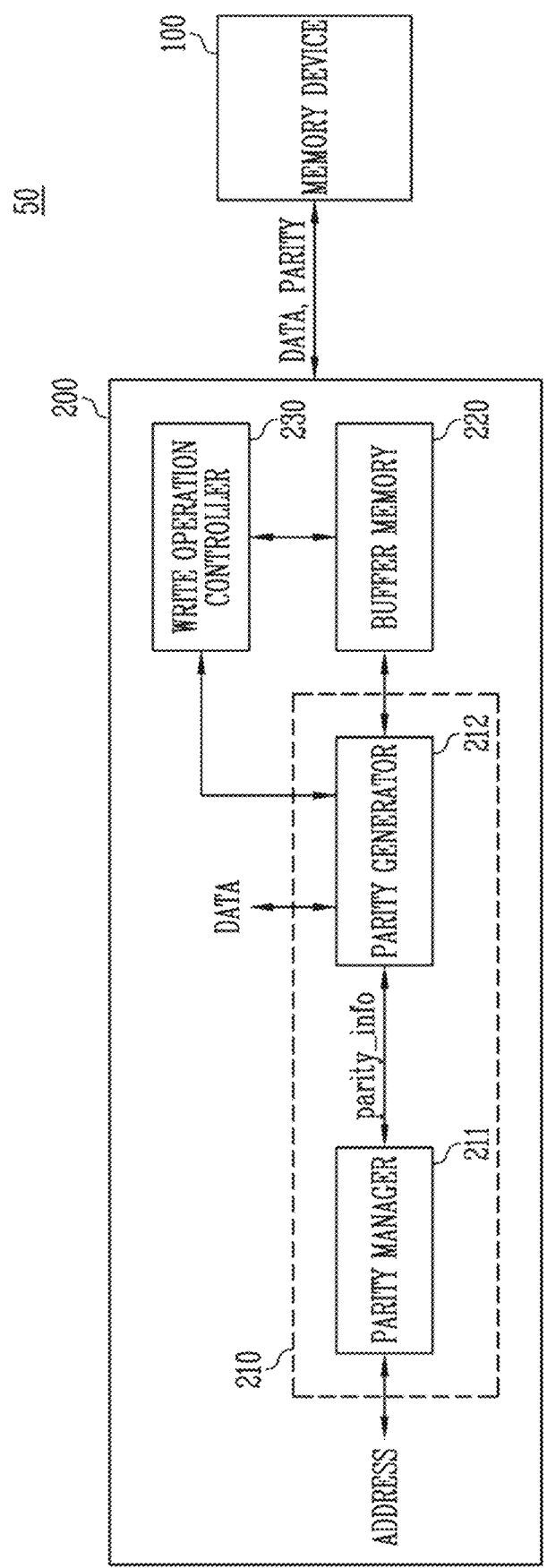
FIG. 5 is a block diagram illustrating a memory controller generating the one or more parity bits based on an embodiment of the disclosed technology.

FIG. 5 is a block diagram illustrating the memory controller generating the one or more parity bits based on an embodiment of the disclosed technology.

In some implementations, the memory controller 200 may include a parity controller 210, a buffer memory 220, and a write operation controller 230.

In an embodiment, the memory controller 200 may convert the logical address received from the host into the physical address. The parity controller 210 may generate the parity based on the converted physical address. The generated parity may be temporarily stored in the buffer memory 220. The write operation controller 230 may provide the parity and the data temporarily stored in the buffer memory 220 to the memory device 100. The memory device 100 may store the parity and the data in memory cells of a memory location corresponding to the physical address.

In some embodiments of the disclosed technology, the parity controller 210 may include a parity manager 211 and a parity generator 212. The parity manager 211 may receive the physical address. The parity manager 211 may determine whether the physical address corresponding to the target word line is included in the input physical address. The target word line may be at least one word line selected from among the word lines WLs included in the memory device 100.

The parity manager 211 may provide parity information parity_info to the parity generator 212 to generate two or more parities when the physical address corresponding to the target word line is included in the input physical address. The parity information parity_info will be described in detail with reference to FIG. 7.

The parity generator 212 may receive the parity information parity_info and generate the parity in response thereto. For example, the plurality of parities corresponding to the number of parities or a memory location of the parity included in the parity information parity_info may be generated. Specifically, the parity generator 212 may receive the data to be stored in the memory device 100 and perform the XOR operation on the data DATA at least once to generate the parity. The XOR operation may be performed as discussed above with reference to FIG. 2.

The buffer memory 220 may temporarily store the parity. The buffer memory 220 may temporarily store the data DATA to be stored in the memory device 100. In some implementations, the memory controller 200 may include one or more buffer memories 220. In a case of two or more buffer memories 220, the data DATA to be stored in the memory device 100 and the parity may be stored in different buffer memories 220, or may be stored in the same buffer memory 220.

Referring to FIG. 5, the buffer memory 220 is included in the memory controller 200, but in various embodiments, the buffer memory 220 may be positioned outside the memory controller 200 and may be positioned inside the data storage device 50. The buffer memory 220 may be a volatile memory device.

The write operation controller 230 may control the buffer memory 220 so that the data and the parity stored in the buffer memory 220 are stored in the memory device 100. In an embodiment, the write operation controller 230 may control the buffer memory 220 so that the generated parity is stored in a predetermined memory location of the memory device. For example, the write operation controller 230 may control the buffer memory 220 so that the generated parity is stored in the memory cell corresponding to the target word line of the memory device.

Figure 6:
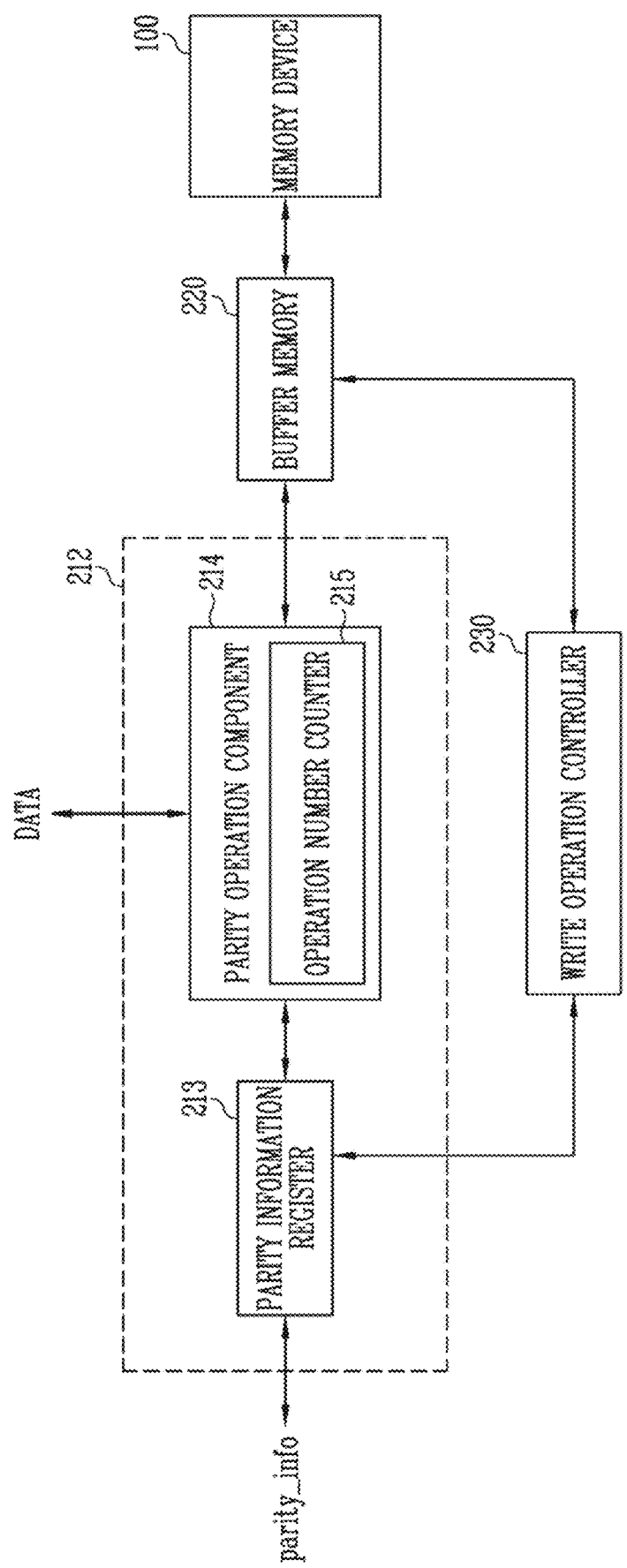
FIG. 6 is a block diagram illustrating an example of a parity generator based on an embodiment of the disclosed technology.

FIG. 6 is a block diagram illustrating an example of the parity generator based on an embodiment of the disclosed technology.

In some implementations, the parity generator 212 may include a parity information register 213 and a parity operation component 214. The parity operation component 214 may include an operation number counter 215.

The parity information register 213 may receive the parity information parity_info from the parity manager and store the parity information parity_info. The parity information parity_info may include information indicating the number of parities to be generated, according to the physical address indicating the memory location where the data is to be stored in the memory device 100.

The parity operation component 214 may perform the XOR operation using the data DATA to be stored in the memory device 100. The parity generated as a result of performing the XOR operation may be temporarily stored in the buffer memory 220. The operation number counter 215 may count the number of the XOR operations performed.

When the number of operations reaches the maximum count that is determined based on the size of the super block corresponding to the parity to be generated, the parity operation component 214 may provide flag information to the parity information register 213. The flag information may indicate whether to provide the generated parity to the memory device 100.

That is, the flag information may indicate whether the XOR operation is completed on all data corresponding to the super block. When the exclusive OR operation is completed on the all data corresponding to the super block, the generated parity may be stored in the memory device 100.

When the exclusive OR operation is not completed on the all data corresponding to the super block, the generated parity may not be stored in the memory device 100. In an embodiment, whether the XOR operation is completed on the all data corresponding to the super block may be determined by the operation number counter 215, for example.

In another embodiment, in addition to the operation number counter 215, it is determined whether the XOR operation is completed on the all data corresponding to the super block based on a time required for the XOR operation.

The buffer memory 220 and the write operation controller 230 may be operated as discussed above with reference to FIG. 5.

FIG. 7 illustrates an example of the parity information.

In some implementations, the parity information parity_info may include at least one of the number of parities to be generated based on the physical address in which the data is to be stored in the memory device, the address in which the parity is to be stored in the memory device, and the size of the super block of the memory device.

Specifically, the logical address received from the host may be converted into the physical address. When it is determined that the converted physical address includes the target address, the parity information parity_info can indicate that two or more parities should be generated. Hereinafter, description will be exemplarily given based on the parities P1 to P3 of FIG. 4.

The number of parities to be generated may vary according to the error occurrence probability of the target address. Here, the parity information parity_info may include information on the number of parities to be generated.

In the example illustrated in FIG. 4, the information on the number of parities to be generated may be 3. The parity information parity_info may include information for generating the first parity corresponding to the first super block of a preset size. In addition, the parity information parity_info may include information for generating the second parity corresponding to the second super block having the size smaller than that of the first super block. In addition, the parity information parity_info may include information for generating the third parity corresponding to the third super block having the size smaller than those of the first super block and the second super block.

The parity information parity_info may include the physical address indicating the memory location where three parities are to be stored in the memory device. Referring to FIG. 4, the parity information parity_info may include the physical addresses respectively indicating the X-th page PGX of the second die DIE2, the X-th page PGX of the fifth die DIE5, and the N-th page PGN of the fifth die DIE5.

The parity information parity_info may include information on the size of the super block indicating a range or area in which each parity may recover an error. Referring to FIG. 4, the parity information parity_info may include information on the size corresponding to the first super block, the size corresponding to the second super block, and the size corresponding to the third super block.

FIG. 8 illustrates information stored in the parity information register according to the parity information.

In some implementations, the parity information register may include at least one of a parity identifier, a parity address, and parity generation completion information.

In an embodiment, the parity identifier may be information identifying the parity corresponding to the super block. The parity address may be information indicating the memory location where the parity is to be stored in the memory device. The parity generation completion information may be information indicating whether the XOR operation is completely performed on all data included in a corresponding super block as a result of performing the XOR operation. That is, the parity generation completion information may indicate whether the parity may be stored in the memory device.

Referring to FIGS. 4 and 8, a parity address ADDRESS2 indicating a memory location where the second parity P2 is to be stored in the memory device 100 and parity generation completion information FLAG2 indicating a state in which the second parity P2 is to be provided to the memory device 100 may be included. Similarly, the parity information register may include each of a parity address and parity generation completion information related to the third parity P3.

Referring to FIG. 4, it is assumed that the data is stored in a sequence from the first page PG1 of the memory dies DIE0 to DIE5 corresponding to the first word line WL1 to the second word line WL2 and the third word line WL3. Here, when the XOR operation is completed on all data corresponding to the third super block, a value of FLAG3 of the parity information register shown in FIG. 8 may change.

For example, the value of FLAG3 may be 0 before the XOR operation is completed on the all data corresponding to the third super block, and the value of FLAG3 may be 1 when the operation is completed.

As the value of FLAG3 becomes 1, the write operation controller may provide the third parity P3 temporarily stored in the buffer memory, to the memory device. The third parity P3 may be stored at a memory location indicated by a third address ADDRESS3.

In an embodiment, the XOR operation may be performed on all data corresponding to the second super block. Similarly, the second parity P2 temporarily stored in the buffer memory may be provided to the memory device according to FLAG2 value indicating whether the operation is completed.

Referring to FIG. 4, all third super block may be included in the second super block. Therefore, when the third parity P3 corresponding to the third super block is generated, the XOR operation may be continuously performed using the third parity P3.

Further, according to the FLAG2 value indicating that generation of the second parity P2 corresponding to the second super block is completed, the second parity P2 temporarily stored in the buffer memory may be provided to the memory device. In addition, all second super block may be included in the first super block.

Therefore, when the second parity P2 corresponding to the second super block is generated, the XOR operation may be continuously performed using the second parity P2. In addition, the first parity P1 temporarily stored in the buffer memory may be provided to the memory device according to the FLAG1 value indicating that generation of the first parity P1 corresponding to the first super block is completed.

Referring to FIGS. 4 and 8, the second parity P2 and the third parity P3 may be stored in at least one of the pages PGX included in the target word line. That is, a second address ADDRESS2 of the second parity P2 may indicate the X-th page PGX corresponding to the target word line of the fifth die DIE5. In addition, the third address ADDRESS3 of the third parity P3 may indicate the X-th page PGX corresponding to the target word line of the second die DIE2.

Furthermore, an error correction circuitry coupled to a parity controller corrects the data included in the first super block according to the first parity P1. The error correction circuitry corrects the data included in the second super block according to the second parity P2. The error correction circuitry corrects the data included in the third super block according to the third parity P3.

Figure 9:
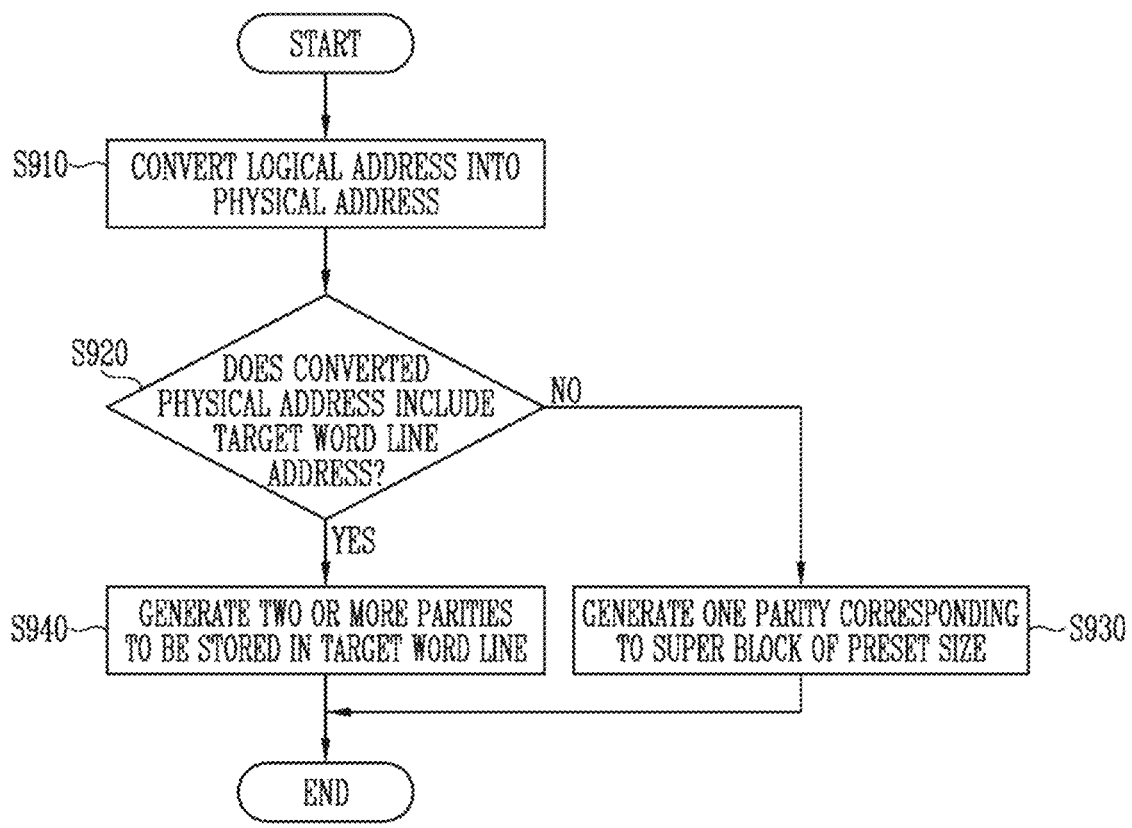
FIG. 9 is a flowchart illustrating example operations for generating the parity according to a physical address based on an embodiment of the disclosed technology.

FIG. 9 is a flowchart illustrating example operations for generating the parity according to the physical address based on an embodiment of the disclosed technology.

In step S910, the data and the logical address may be input from the host to the memory controller, and the memory controller may convert the logical address to the physical address.

In step S920, it may be determined whether the converted physical address includes a target word line address. In an embodiment, the target word line address may indicate memory cells of which reliability of data is relatively low. For example, the target word line address may indicate a word line having a high error occurrence probability when reading data. When the converted physical address does not include the target word line address, the operation may proceed to step S930. When the converted physical address includes the target word line address, the operation may proceed to step S940.

In step S930, one parity corresponding to the super block of a preset size may be generated. The one parity may be generated when the XOR operation is completely performed on all data included in the super block of the preset size.

In step S940, two or more parities may be generated. Here, one parity may correspond to the super block of the preset size. The other parity may correspond to a super block having a size smaller than that of the super block of the preset size and all included in the super block of the preset size. In an embodiment, the memory controller may provide the two or more generated parities to the memory device such that the two or more generated parities are stored in the target word line.

Figure 10:
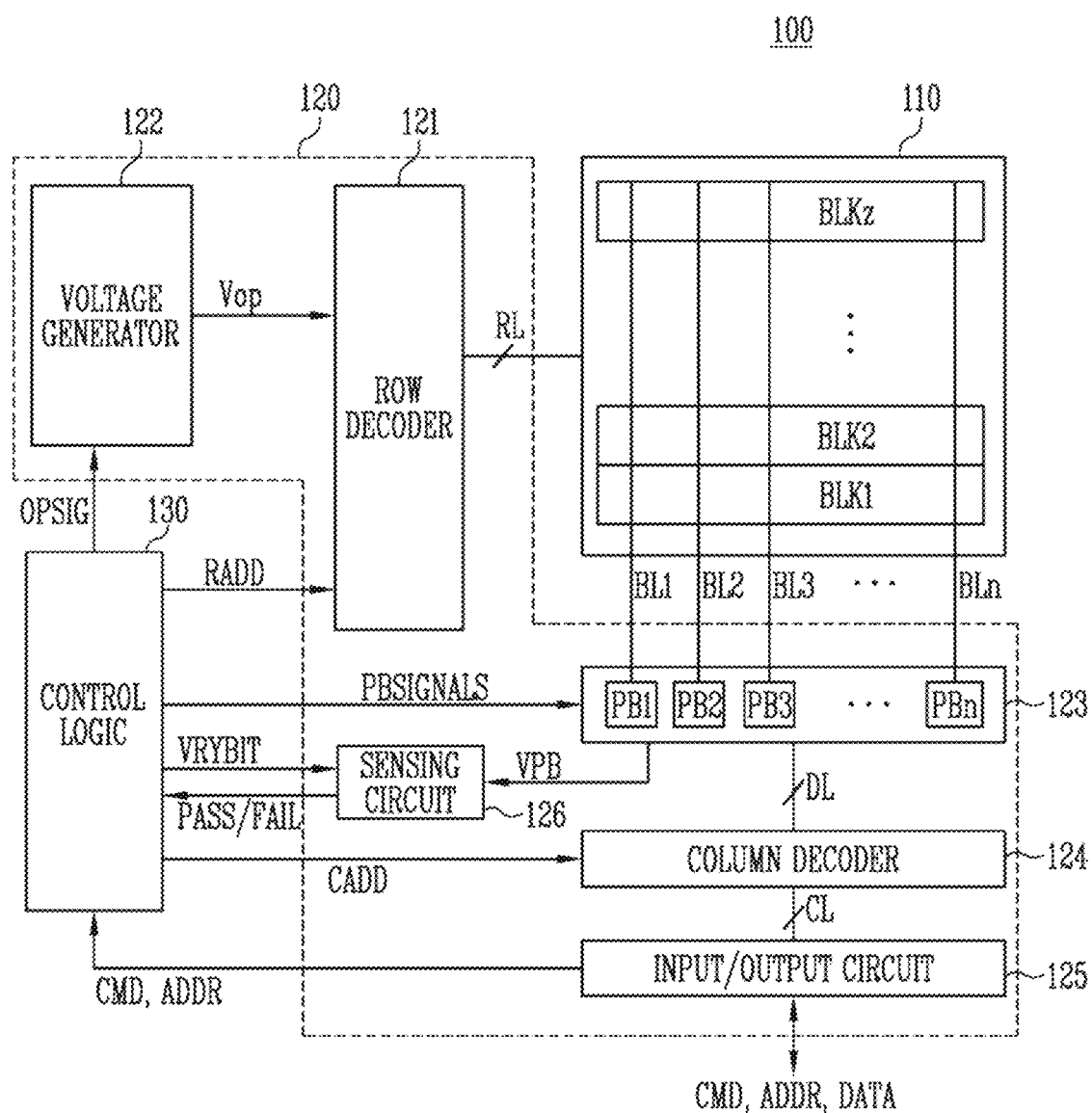
FIG. 10 illustrates an example of the memory device 100 based on an embodiment of the disclosed technology.

FIG. 10 illustrates an example of the memory device 100 based on an embodiment of the disclosed technology.

Referring to FIG. 10, the memory device may include a memory cell array 110, a peripheral circuit 120, and a control logic 130.

The memory cell array 110 includes a plurality of memory blocks BLK1 to BLKz. The plurality of memory blocks BLK1 to BLKz are connected to an address decoder 121 through row lines RL. The memory blocks BLK1 to BLKz may be connected to a page buffer group 123 through bit lines BL1 to BLn. Each of the plurality of memory blocks BLK1 to BLKz includes a plurality of memory cells. As an embodiment, the plurality of memory cells are non-volatile memory cells. Memory cells connected to the same word line may be defined as one page. That is, the memory cell array 110 is configured of a plurality of physical pages. Thus, one memory block may include a plurality of pages.

Each of the memory cells included in the memory cell array 110 may be configured as a single level cell (SLC) storing one data bit, a multi-level cell (MLC) storing two data bits, a triple level cell (TLC) storing three data bits, or a quad level cell (QLC) storing four data bits.

The peripheral circuit 120 may be configured to perform the program operation, the read operation, or the erase operation on a selected area of the memory cell array 110 in response to commands and control signals received from the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include the address decoder 121, a voltage generator 122, the page buffer group 123, a column decoder 124, an input/output circuit 125, and a sensing circuit 126.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include at least one source select line, a plurality of word lines, and at least one drain select line. In an embodiment, the word lines may include normal word lines and dummy word lines. The row lines RL may further include a pipe select line.

The address decoder 121 is configured to operate in response to the control of the control logic 130. The address decoder 121 receives a row address RADD from the control logic 130.

The address decoder 121 is configured to decode the row address RADD. The address decoder 121 selects at least one memory block among the memory blocks BLK1 to BLKz according to a decoded address. In addition, the address decoder 121 may select at least one word line of the memory block selected to apply voltages generated by the voltage generator 122 to at least one word line WL according to the decoded address.

For example, during the program operation, the address decoder 121 may apply a program voltage to a selected word line and apply a program pass voltage of a level lower than that of the program voltage to unselected word lines. During a program verify operation, the address decoder 121 may apply a verify voltage to the selected word line and apply a verify pass voltage higher than the verify voltage to the unselected word lines. During the read operation, the address decoder 121 may apply a read voltage to the selected word line and apply a read pass voltage higher than the read voltage to the unselected word lines.

In an embodiment, the erase operation of the memory device 100 is performed in a memory block unit. During the erase operation, the address decoder 121 may select one memory block according to the decoded address. During the erase operation, the address decoder 121 may apply a ground voltage to word lines connected to the selected memory block.

The voltage generator 122 operates in response to the control of the control logic 130. The voltage generator 122 is configured to generate a plurality of voltages using an external power voltage supplied to the memory device. Specifically, the voltage generator 122 may generate various operation voltages Vop used in the program, read, and erase operations in response to operation signal OPSIG. For example, the voltage generator 122 may generate a program voltage, a verify voltage, a pass voltage, a read voltage, an erase voltage, and the like in response to the control of the control logic 130.

As an embodiment, the voltage generator 122 may generate an internal power voltage by regulating an external power voltage. The internal power voltage generated by the voltage generator 122 is used as an operation voltage of the memory device 100.

As an embodiment, the voltage generator 122 may generate a plurality of voltages using an external power voltage or an internal power voltage.

For example, the voltage generator 122 may include a plurality of pumping capacitors that receive the internal power voltage, and selectively activate the plurality of pumping capacitors in response to the control of the control logic 130 to generate the plurality of voltages.

The generated plurality of voltages may be supplied to the memory cell array 110 by the address decoder 121.

The buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate under the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when a program pulse is applied to the selected word line, the first to n-th page buffers PB1 to PBn may transfer data DATA, which is received through the input/output circuit 125, to selected memory cells through the first to n-th bit lines BL1 to BLn. The memory cells of the selected page are programmed according to the transferred data DATA. A memory cell connected to a bit line to which a program permission voltage (for example, the ground voltage) is applied may have an increased threshold voltage. A threshold voltage of a memory cell connected to a bit line to which a program prohibition voltage (for example, the power voltage) is applied may be maintained. During the program verify operation, the first to n-th page buffers PB1 to PBn read page data from the selected memory cells through the first to n-th bit lines BL1 to BLn.

During the read operation, the first to n-th page buffers PB1 to PBn read the data DATA from the memory cells of a selected page through the first to n-th bit lines BL1 to BLn, and outputs the read data DATA to the input/output circuit 125 in response to commands and control signals received from the column decoder 124.

During the erase operation, the first to n-th page buffers PB1 to PBn may float the first to n-th bit lines BL1 to BLn.

The column decoder 124 may transfer data between the input/output circuit 125 and the page buffer group 123 in response to the column address CADD. For example, the column decoder 124 may exchange data with the first to n-th page buffers PB1 to PBn through data lines DL or may exchange data with the input/output circuit 125 through column lines CL.

The input/output circuit 125 may transfer the command CMD and the address ADDR received from the memory controller 200 described with reference to FIG. 1 to the control logic 130, or may exchange the data DATA with the column decoder 124.

The sensing circuit 126 may generate a reference current in response to a permission bit signal VRYBIT during the read operation or the verify operation, and may compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. In addition, the control logic 130 may determine whether the verify operation is passed or failed in response to the pass or fail signal PASS or FAIL.

Figure 11:
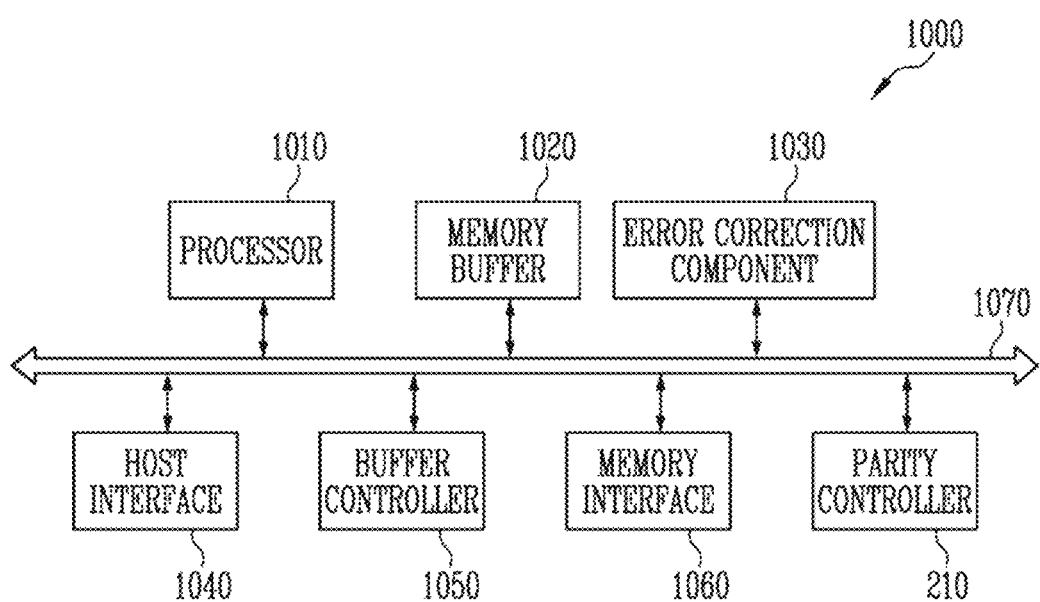
FIG. 11 illustrates another example of the memory controller of FIG. 1 based on some embodiments of the disclosed technology.

FIG. 11 illustrates another example of the memory controller of FIG. 1 based on some embodiments of the disclosed technology.

The memory controller 1000 is connected to a host Host and the memory device. The memory controller 1000 is configured to access the memory device in response to the request from the host Host.

Referring to FIG. 11, the memory controller 1000 may include a processor 1010, a memory buffer 1020, an error correction component or circuit (ECC) 1030, a host interface 1040, a buffer controller 1050, a memory interface 1060, a bus 1070 and a parity controller 210.

The bus 1070 may be configured to provide a channel between components of the memory controller 1000.

The processor 1010 may control overall operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the data storage device using the memory buffer 1020 as an operation memory, a cache memory, or a buffer memory.

The processor 1010 may perform a function of a flash translation layer (FTL). The processor 1010 is configured to randomize data received from the host Host. For example, the processor 1010 may randomize the data received from the host Host using a random seed. The randomized data is provided to the memory device as data to be stored and is programmed to the memory cell array.

The processor 1010 is configured to de-randomize data received from the memory device during the read operation. For example, the processor 1010 may de-randomize the data received from the memory device using a random seed. The de-randomized data may be output to the host Host.

As an embodiment, the processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The ECC circuitry 1030 may perform error correction. The ECC circuitry 1030 may perform error correction encoding (ECC encoding) based on data to be written to the memory device through memory interface 1060. The error correction encoded data may be transferred to the memory device through the memory interface 1060. The ECC circuitry 1030 may perform error correction decoding (ECC decoding) on the data received from the memory device through the memory interface 1060. In the specific example shown in FIG. 11, the ECC circuitry 1030 is a separate circuit from the memory interface 1060. In some others implementations, for example, the ECC circuitry 1030 may be included in the memory interface 1060 as a component of the memory interface 1060.

The host interface 1040 is configured to communicate with an external host in response to commands and control signals received from the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 may not include the memory buffer 1020 and the buffer controller 1050.

For example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and may not interfere with each other or affect each other. The data bus may be connected to the host interface 1040, the buffer controller 1050, the ECC circuitry 1030, and the memory interface 1060. The control bus may be connected to the host interface 1040, the processor 1010, the buffer controller 1050, the memory buffer 1202, and the memory interface 1060.

In an embodiment, the parity controller 210 may generate a first parity using data to be written to a first group of pages among a plurality of pages, and generate a second parity using data to be written to a second group of pages among the plurality of pages. In addition, the error correction component or circuit (ECC) 1030 may apply the first parity and the second parity to correct at least one of the plurality of pages arranged to belong to the first group of pages and the second group of pages.

Figure 12:
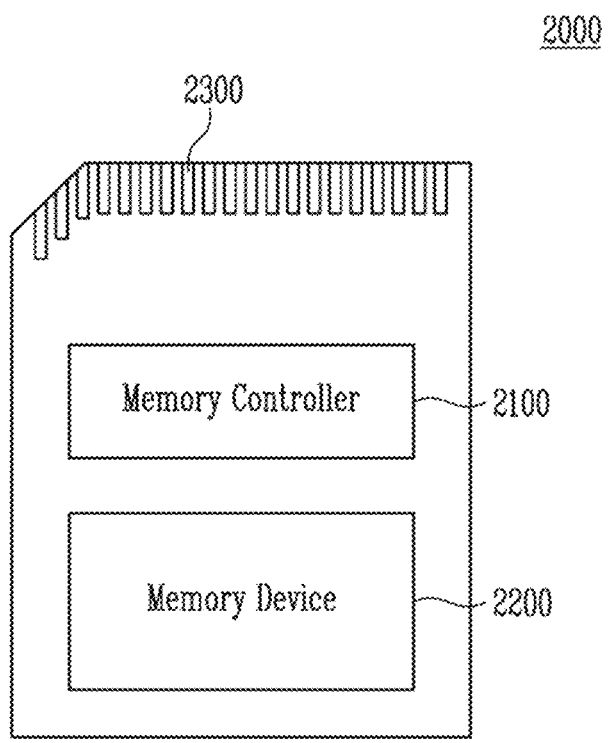
FIG. 12 is a block diagram illustrating a memory card system as an example of the data storage device including the memory device implemented based on an embodiment of the disclosed technology.

FIG. 12 is a block diagram illustrating a memory card system as an example of the data storage device including the memory device implemented based on an embodiment of the disclosed technology.

In some implementations, the memory card system 2000 includes a memory controller 2100, a memory device 2200, and a connector 2300.

The memory controller 2100 is connected to the memory device 2200. The memory controller 2100 is configured to access the memory device 2200. The memory controller 2100 may be implemented equally to the memory controller 200 described with reference to FIG. 1.

For example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be implemented as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

For example, the memory controller 2100 or the memory device 2200 may be packaged and provided as one semiconductor package in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP). Alternatively, the memory device 2200 may include a plurality of non-volatile memory chips, and the plurality of non-volatile memory chips may be packaged and provided as one semiconductor package based on the above-described package methods.

For example, the memory controller 2100 and the memory device 2200 may be integrated into one semiconductor device. For example, the memory controller 2100 and the memory device 2200 may be integrated into one semiconductor device to configure a solid state drive (SSD). The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

For example, the memory device 2200 may be the memory device 100 described with reference to FIG. 1.

Figure 13:
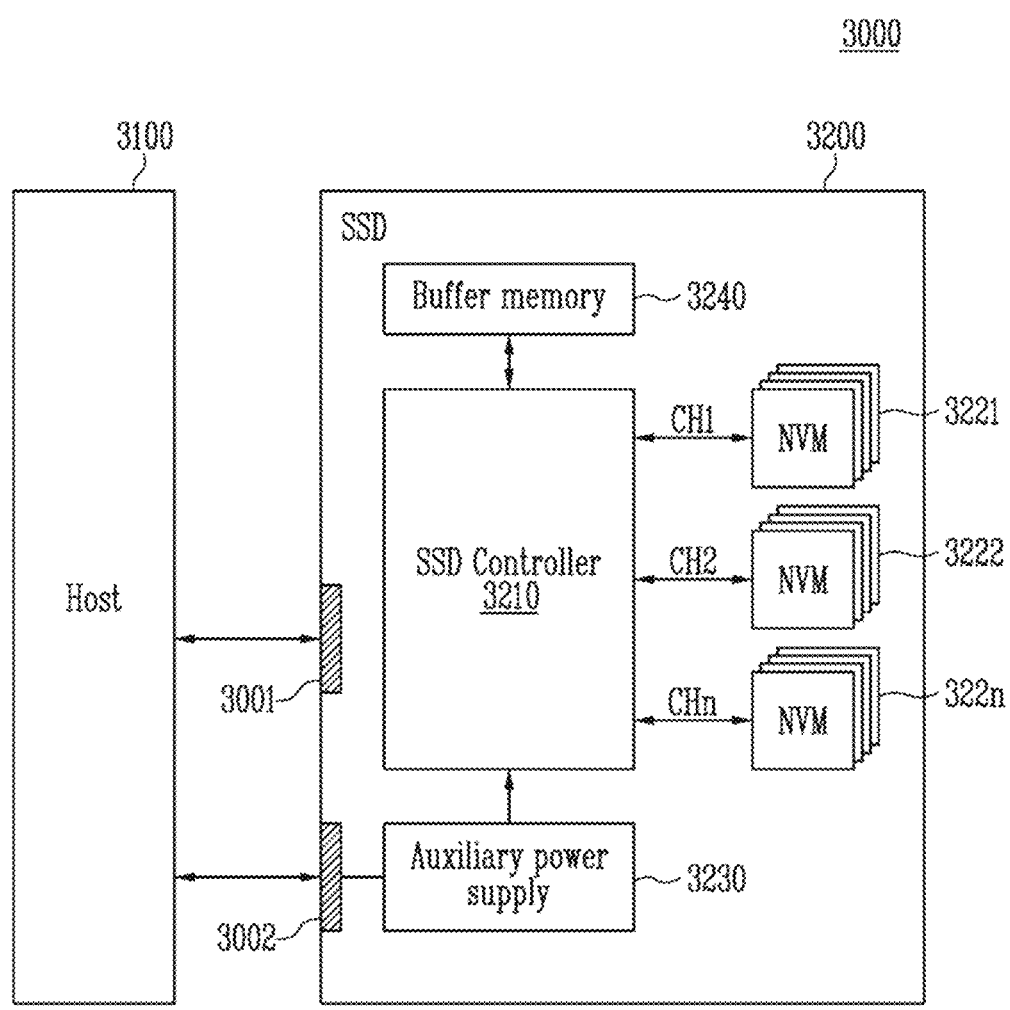
FIG. 13 is a block diagram illustrating a solid state drive (SSD) system as an example of the data storage device including the memory device implemented based on an embodiment of the disclosed technology.

FIG. 13 is a block diagram illustrating a solid state drive (SSD) system as an example of the data storage device including the memory device implemented based on an embodiment of the disclosed technology.

In some implementations, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe.

The auxiliary power supply 3230 is connected to the host 3100 through the power connector 3002. The auxiliary power supply 3230 may receive the power PWR from the host 3100 and may charge the power. The auxiliary power supply 3230 may provide power of the SSD 3200 when power supply from the host 3100 is not smooth. For example, the auxiliary power supply 3230 may be positioned in the SSD 3200 or may be positioned outside the SSD 3200. For example, the auxiliary power supply 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

For example, the non-volatile memories 3321 to 322n may be the memory device 100 described with reference to FIG. 1.

Figure 14:
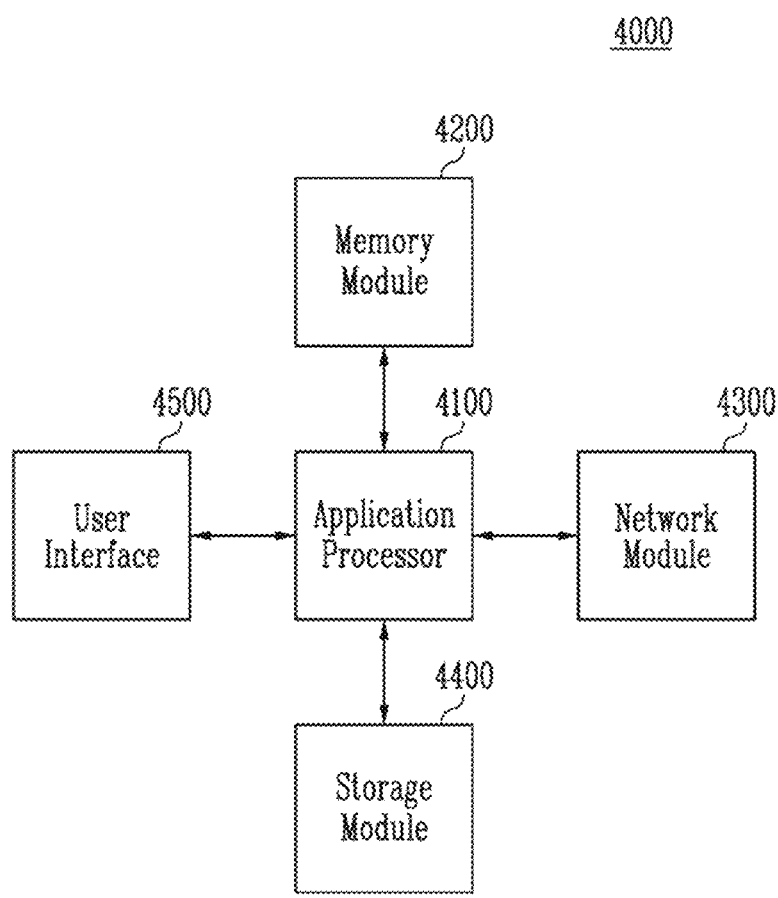
FIG. 14 is a block diagram illustrating a user system including the data storage device including the memory device based on an embodiment of the disclosed technology.

FIG. 14 is a block diagram illustrating a user system including the data storage device including the memory device based on an embodiment of the disclosed technology.

In some implementations, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and a FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable data storage device (removable drive), such as a memory card, and an external drive of the user system 4000.

For example, the storage module 4400 may include a plurality of non-volatile memory devices, and the plurality of non-volatile memory devices may be the memory device 100 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory controller comprising:
   a parity controller configured to generate a first parity using data to be written to a first group of pages among a plurality of pages of a memory device, and generate a second parity using data to be written to a second group of pages among the plurality of pages;
   a write operation controller configured to control the memory device to store the first parity and the second parity; and
   an error correction circuitry configured to correct data read from at least one of the plurality of pages based on the first parity or the second parity,
   wherein the first group of pages includes the second group of pages and at least one page different from the second group of pages among the plurality of pages.

2. The memory controller of claim 1, wherein the parity controller comprises:
   a parity manager configured to generate parity information indicating a memory location where the first parity and the second parity are stored among the plurality of pages; and
   a parity generator configured to generate the first parity and the second parity based on the parity information.

3. The memory controller of claim 2, wherein the first parity includes a result of an exclusive OR operation on the data to be written to the first group of pages, and the second parity includes a result of an exclusive OR operation on the data to be written to the second group of pages.

4. The memory controller of claim 1, wherein the write operation controller is further configured to control the memory device to store the first parity and the second parity in a first page and a second page corresponding to a target word line among the plurality of pages, respectively.

5. The memory controller of claim 4, wherein the target word line includes a word line corresponding to pages to store the first parity and the second parity, among a plurality of word lines corresponding to the plurality of pages.

6. The memory controller of claim 5, wherein the target word line is determined based on an error rate of data read from the plurality of pages.

7. The memory controller of claim 5, wherein an error rate of data read from pages coupled to the target word line is higher than error rates of data read from pages coupled to word lines different from the target word line among the plurality of word lines.

8. A data storage device comprising:
a memory device including a plurality of pages;
a memory controller configured to control the memory device to store a first parity generated using data stored in a first group of pages among the plurality of pages and store a second parity generated using data stored in a second group of pages among the plurality of pages; and
an error correction circuitry configured to correct data read from at least one of the plurality of pages based on the first parity or the second parity,
wherein the first group of pages includes the second group of pages, and at least one page different from the second group of pages among the plurality of pages.

9. The data storage device of claim 8, wherein the memory controller is further configured to generate the first parity and the second parity based on parity information indicating a memory location where the first parity and the second parity are stored among the plurality of pages.

10. The data storage device of claim 9, wherein the first parity includes a result of an exclusive OR operation on data to be written to the first group of pages, and
the second parity includes a result of an exclusive OR operation on data to be written to the second group of pages.

11. The data storage device of claim 8, wherein the memory controller is further configured to control the memory device to store the first parity and the second parity in a first page and a second page corresponding to a target word line among the plurality of pages, respectively.

12. The data storage device of claim 11, wherein the target word line includes a word line corresponding to pages to store the first parity and the second parity, among a plurality of word lines corresponding to the plurality of pages.

13. The data storage device of claim 12, wherein the target word line is determined based on an error rate of data read from the plurality of pages.

14. The data storage device of claim 12, wherein an error rate of data read from pages coupled to the target word line is higher than error rates of data read from pages coupled to word lines different from the target word line among the plurality of word lines.

15. The data storage device of claim 8, wherein the number of pages included in the first group and the number of pages included in the second group are different from each other.

* * * * *